United States Patent [19]

Okazaki

[11] Patent Number: 4,843,635
[45] Date of Patent: Jun. 27, 1989

[54] CHANNEL SELECTING PANEL HOLDER FOR TELEVISION SET

[75] Inventor: Masanori Okazaki, Ohtawara, Japan

[73] Assignee: Sharp Kabushiki Kaisha, Osaka, Japan

[21] Appl. No.: 86,477

[22] Filed: Aug. 18, 1987

Related U.S. Application Data

[63] Continuation of Ser. No. 810,846, Dec. 20, 1985, Pat. No. 4,709,405.

[51] Int. Cl.⁴ .......................... H04B 1/08; H04N 5/64
[52] U.S. Cl. .................................... 455/151; 455/128; 455/348; 455/352; 455/603; 358/194.1; 358/254
[58] Field of Search ............................ 358/194.1, 254; 455/128, 151, 153, 352, 353, 354, 355, 347, 348, 349, 603; 312/7.2

[56] References Cited

U.S. PATENT DOCUMENTS

| | | | |
|---|---|---|---|
| 3,294,906 | 12/1966 | Swanson | 312/7.2 |
| 3,970,782 | 7/1976 | Fenne | 455/349 |

FOREIGN PATENT DOCUMENTS

| | | | |
|---|---|---|---|
| 2368096 | 5/1978 | France | 455/352 |
| 2423103 | 12/1979 | France | 358/254 |

*Primary Examiner*—Michael A. Masinick
*Attorney, Agent, or Firm*—Birch, Stewart, Kolasch, & Birch

[57] ABSTRACT

A channel selecting panel holder rotatably stores an operating section comprising a remote control transmitter inside the cabinet of a television set, video recorder and the like. The transmitter serves as an operating apparatus for the teleivison set. The operating apparatus is stored in a storage section provided in the cabinet.

4 Claims, 6 Drawing Sheets

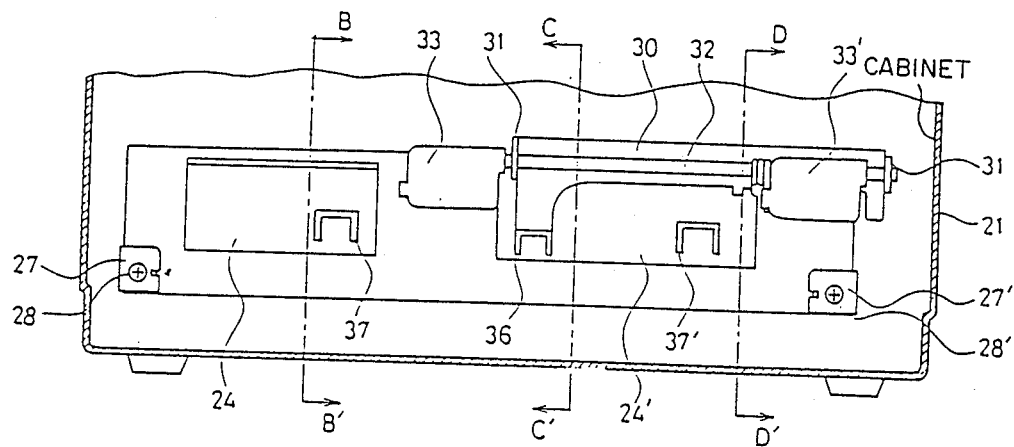
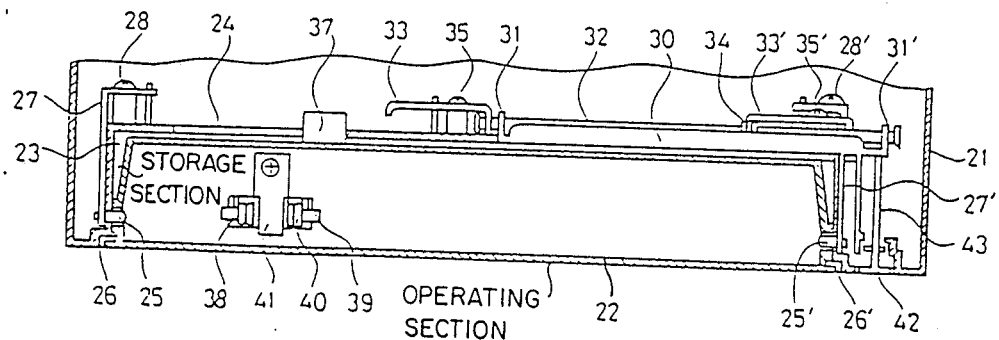
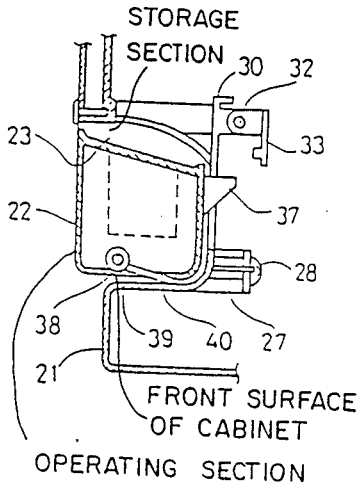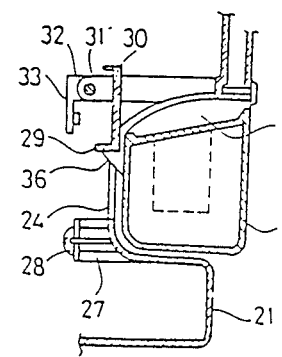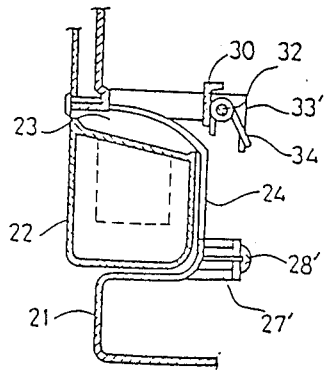

CHANNEL SELECTING PANEL HOLDER FOR TELEVISION SET

This application is a continuation of copending application Ser. No. 810,846, filed on Dec. 20, 1985 now U.S. Pat. No. 4,709,405.

BACKGROUND OF THE INVENTION

The present invention relates to the improvement of a television set, and, especially, a television set which is capable of being operated by remote control.

More particularly, the present invention is concerned with a channel selecting panel holder which comprises a remote control apparatus provided with a channel selecting knob and a volume control knob built into it, so that it is inserted into a cabinet.

In a conventional television set, a panel as an operating section which is provided with different types of control knobs and the like, is fixed into the front surface of the cabinet, and the knobs and the like are exposed on the surface of the cabinet. Because the knobs and switches are exposed from the surface of the cabinet, the exterior view of a conventional television set is not attractive.

Recently, television sets tend to be provided with simple exteriors for improving their design.

Accordingly, a rotatable operating section, provided with a channel selecting knob and the like, is inserted into the cabinet, and when the television set is not in use, this operating section is stored within the cabinet.

However, in this type of television set, when an opening and closing unit becomes complex, there is the problem that the work efficiency is poor.

OBJECTS AND SUMMARY OF THE INVENTION

An object of the present invention is to provide an improved television set with a superior external appearance, eliminating the above problems.

Another object of the present invention is to provide an improved channel selecting panel holder with a simple rotatable construction which can be reliably supported in order to eliminate the above problems.

Other objects and further scope of applicability of the present invention will become apparent from the detailed description given hereinafter. It should be understood, however, that the detailed description of and specific examples, while indicating preferred embodiments of the invention are given by way of illustration only, since various changes and modifications within the spirit and scope of the invention will become apparent to those skilled in the art from this detailed description.

According to one embodiment of the present invention, a channel selecting panel holder of a television set includes a storage section in the front face of the television cabinet. A control section equipped with knobs and the like is rotatably installed with an elastic material within the television cabinet. A retention body comprising a hook or the like as an engagement member, is located on the back surface of the cabinet. The control section can be supported in a closed state, and at the same time, can be opened by a push button located in the front face of the cabinet.

According to another embodiment of the present invention, a channel selecting panel holder of a television set detachably contains a remote control transmitter on the front surface of the television set. In the television set, an operating switch of that transmitter usually serves to select the channel of the set. There is also provided a tubular reflection plate in the periphery of the transmission path of the signal sent out from the transmitting apparatus.

According to still another embodiment of the present invention, a channel selecting panel holder of a television set has a storage section in the front face of the TV cabinet. In the storage section, an operating section provided with a switching button or the like is rotatably installed, and in the cabinet, a push button comprising a shaft stressed by an elastic material is provided. An engagement member is provided to keep the operating section in a closed state with the help of the shaft. A stopper is provided to keep the operation section in an open state, and in addition a spring is provided for rotation.

In still another embodiment of the present invention, a channel selecting panel holder is provided with a concave storage section in the front face of the television cabinet, and, in that concave storage section, a freely rotatable operating section is provided with a selection button. In the cabinet, a slider is stressed in one direction by an elastic material. The slider can slide in a different direction than the control section's rotating direction. The slider resists the strength of the elastic material, and is provided with a push button apparatus which is made to slide in one direction into the operating section, so that the above mentioned slider is engaged, and is equipped with a stopper which permits the operating section to be positioned either in the open state or in the closed state.

BRIEF DESCRIPTION OF THE DRAWINGS

The present invention will be better understood from the detailed description given hereinbelow and the accompanying drawings which are given by way of illustration only, and thus are not limitative of the present invention and wherein:

FIG. 5 is a back elevational view of one embodiment of a channel selecting panel holder according to the present invention;

FIG. 6 is a sectional plan view of one embodiment of a channel selecting panel holder according to the present invention;

FIG. 7 is a sectional view taken on the line B-B' in FIG. 5 in the direction of the arrows;

FIG. 8 is a sectional view taken on the line C-C' in FIG. 5 in the direction of the arrows;

FIG. 9 is a sectional view taken on the line D-D' in FIG. 5 in the direction of the arrows;

DETAILED DESCRIPTION OF THE INVENTION

Figure 1:
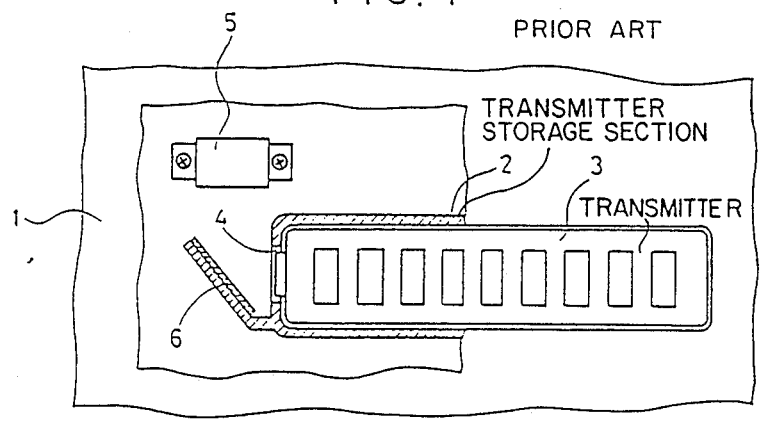
FIG. 1 is a cutaway front elevation of a conventional remote control transmitter apparatus.

Conventionally, in a remote control apparatus which remotely controls channel selection, a transmitter in a television set which comprises a transmitting device functioning as a channel and volume control of the main body of the television set is installed in the main body of the television set, and in order to select the channel, it is usually constructed as shown in FIG. 1.

The front face of a television set cabinet 1 includes a concave-shaped transmitter storage section 2, and, an aperture 4 is provided in one side surface of this storage section 2, in order to scatter a signal from a transmitter 3 to the main body. A reflection plate 6 is installed in the vicinity of this aperture 4, in order to reflect a signal to a receiving device 5 attached to the top side above the transmitter 3, and the signal from the transmitter 3 is reflected by the reflecting plate 6, and scattered to the receiving device 5.

However, in the conventional apparatus, at the time when the signal is transmitted by the reflecting plate 6, the signal is diffused and there is the fear that a large transmission loss will cause an error in operation.

The present invention relates to a channel selecting panel holder which eliminates the above problems, and is able to transmit reliably signals. The remote control transmitter is stored in the operating section, and in addition, this operating section is installed in the cabinet, in a freely rotatable way and, when the television set is not being used, the operating section can be stored inside the cabinet.

Figure 2:
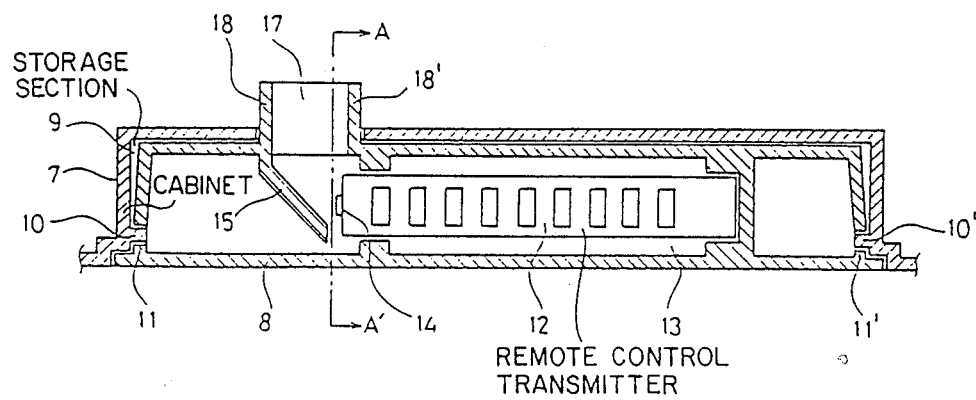
FIG. 2 is a sectional plan drawing of one embodiment of a channel selecting panel holder according to the present invention.
Figure 3:
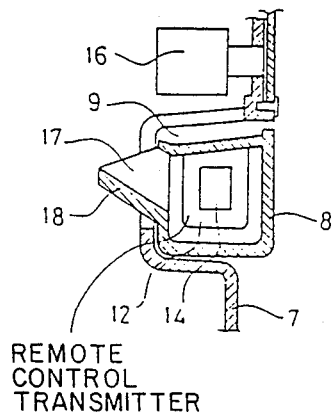
FIG. 3 is a sectional view taken on the line A-A' in FIG. 2 in the direction of the arrows.
Figure 4:
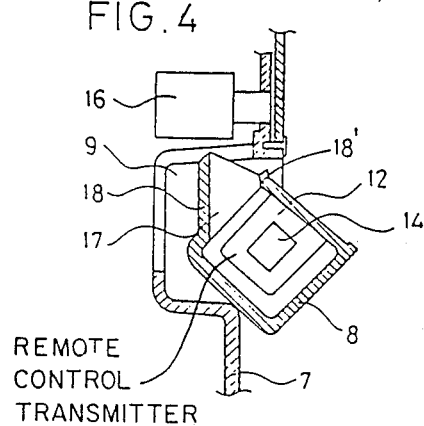
FIG. 4 is a sectional side elevation of one embodiment of the present invention.

The following is a detailed explanation of one embodiment of the present invention, with reference to FIG. 2 to FIG. 4.

FIG. 2 is a sectional plan view of one embodiment of a channel selecting panel holder according to the present invention.

FIG. 3 is a sectional view taken on the line A-A' in FIG. 2 in the direction of the arrows;

FIG. 4 shows the embodiment of the present invention shown in FIG. 3 with the front face of the operating section open, so that the remote control transmitter can be taken out or can be operated as a channel selector.

A storage section 9 stores an operating section 8 in the front face of the cabinet 7 of the television set. The storage section 9 is shaped as shown in FIG. 2 and FIG. 3. Convex sections 10 and 10' are provided in the side of the storage section 9 to engage apertures 11 and 11' provided in both sides of the operating section 8, allowing the operating section 8 to be installed so that it is rotatable.

An operating panel face of the operating section 8 forms a concave section 13, in which a remote control transmitter 12 is stored, and a reflecting panel 15 is provided to reflect the signal in the vicinity of a signal generating section 14 of the remote control transmitter 12. A tubular section 17 is provided in the back surface of the operating section 8 to transmit the signal to a receiving unit 16. Reflection plates 18 and 18' are positioned on the periphery of the inner surface of the tubular section 17.

The operating section 8 is usually stored in the interior of the cabinet 7, and, in use, as shown in FIG. 4, it is pulled out in the forward direction to operate it. The remote control transmitter 12 is removed from the operating section 8, so that the remote control transmitter transmits signals to the receiver 16 from the outside.

As outlined above, in this embodiment of the present invention, the path for the signals is surrounded by the tubular shape of the reflection plates 18 and 18'. Because the dispersion of the signals can be prevented because the reflection plate 18 and 18' is tubular, the signals can be reliably transmitted. Furthermore, by rotating the operating section 8, because it is rotatably installed in the cabinet, when the operating section 8 is not being used, it can be stored in the interior of the cabinet, and the outer surface of the cabinet is made flat.

Next follows an explanation of another embodiment of a channel selecting panel holder according to the present invention.

FIG. 5 is a back elevational view of one embodiment of a channel selecting panel holder according to the present invention.

FIG. 6 is a sectional plan view of one embodiment of a channel selecting panel holder according to the present invention.

FIG. 7 is a sectional view taken on the line B-B' in FIG. 5 in the direction of the arrows.

FIG. 8 is a sectional view taken on the line C-C' in FIG. 5 in the direction of the arrows.

FIG. 9 is a sectional view taken on the line D-D' in FIG. 5 in the direction of the arrows.

A storage section 23 for storing an operating section 22 is formed in the front surface of a cabinet 21 of a television set. In the back surface of the storage section 23, a plurality of apertures 24 and 24' are provided. Into apertures 26, 26' engagement members 25 and 25' are inserted.

L-shaped leaf springs 27 and 27' are installed on the cylindrical engagement members 25 and 25' in the vicinity of the both ends of the storage section 23. The springs 27 and 27' are affixed to the cabinet 21 by screws 28 and 28' from the outside back surface of the storage section 23, and, in addition, the engagement members 25 and 25' are inserted into the apertures 26 and 26'.

An operating section 22 is kept stored. A lock plate 30, is formed having a hook 29, and a shaft 32 is penetrated into a shaft-attaching sections 31 and 31' bent.

Two pressure plates 33 and 33' are installed on the shaft 32 in order to fix the lock plate 30 onto the cabinet 21, and a coil spring 34 is attached in order to push out the lock plate 30 in the forward direction.

The pressure plates 33 and 33' are attached to the outside of the storage section 23 with the screws 35 and 35'.

A projection 36 is provided on the back surface of the operating section 22, in the position opposing to the hook 29 provided on the lock plate 30, and stoppers 37 and 37' are formed in some locations to position the operating section 22 when it is rotated.

An aperture 38 is formed in the lower surface of the operating section 22, and a spring 40 attached to the shaft 39, by means of an angle bar 41, is attached to part of the aperture 38. By means of the connecting member (not shown in the drawings) which is made in a U-shape and has parts wound in the form of a coil in the both ends. The spring 40 is united.

A pressure plate 42 is provided in the neighborhood of the storage section 23 which is provided in the front surface of the cabinet 21, and in the back surface of the pressure plate 42, a rib 43 is formed near the position of the lock plate 30.

The storage section of the concave remote control transmitter is provided in the upper surface of the operating panel of the operating section 22.

When the operating section 22 is stored in the storage section 23, by pressing the operating section 22 into the storage section 23, the engagement members 25 and 25' are pushed back by means of the elasticity of the leaf springs 27 and 27', and furthermore, on pressing the operating section 22, the engagement members 25 and 25' are inserted into the apertures 26 and 26' provided in both sides of the operation section 22, so that the operating section 22 is secured in the storage section 23. In this way, when the operating section 22 attached to the cabinet 21 is opened, by pushing the pressure plate 42, the lock plate 30 is pressed in the back direction by the rib 43 of the lock plate 30, and the hook 29 is separated from the projection 36, and with the help of the elasticity of the spring 40 provided on the bottom surface of the operating section 22, the operating section 22 is made to rotate until it is engaged at an appropriate position by the stoppers 37 and 37'. Also, when being closed, the operating section 22 is pressed by hand, and with its rotation, the projection 36 is engaged by the hook 29, and the operating section 22 is locked.

In this way, the operating section 22 can be easily locked or unlocked in the television set in the above embodiment, and the outside design of the cabinet is made flat.

Figure 10:
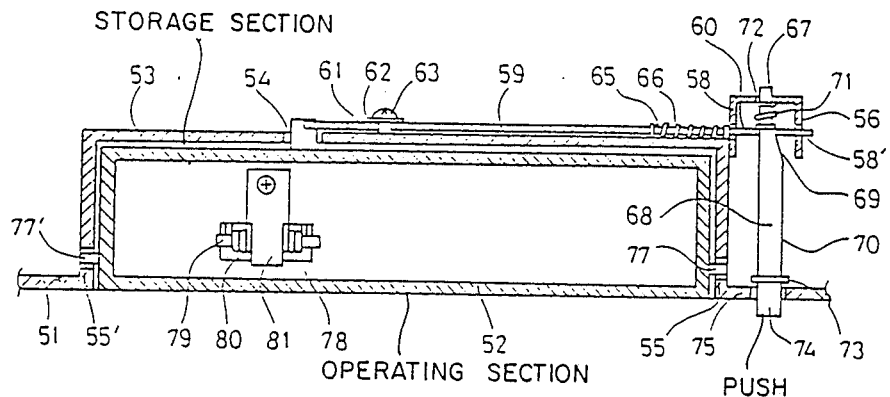
FIG. 10 is a sectional plan view of still another channel selecting panel holder according to the present invention.
Figure 11:
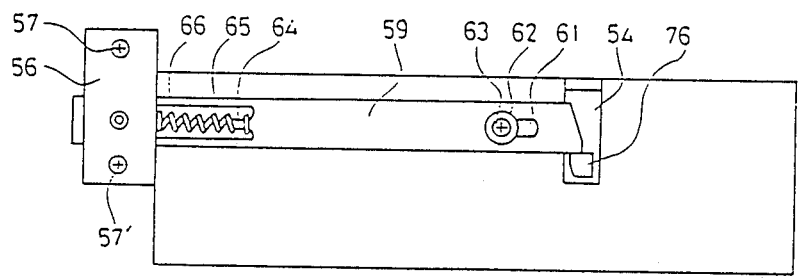
FIG. 11 is a rear view of the front face of a television cabinet containing a television set with one embodiment of a channel selecting panel holder according to the present invention.
Figure 12:
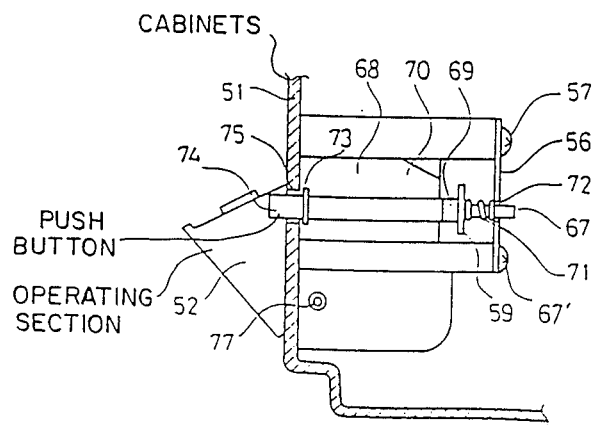
FIG. 12 is a sectional side elevational view of another embodiment of a channel selecting panel holder according to the present invention.

The following is an explanation of a further embodiment of the present invention which is illustrated in FIG. 10 to FIG. 12.

A concave storage section 53 in the front face of a television set cabinet 51 stores an operating section 52. An elongated aperture 54 is formed in the storage section 53. The concave storage section 53 contains engagement members 55 and 55' to fix the storage member 52 at both sides. A U-shaped angle bar 56 on the outer side of the concave storage section 53 is installed on the cabinet 51 by means of screws 57 and 57', and a slide plate 59 is inserted into apertures 58 and 58' provided on both sides of the angle bar 56. An aperture 60, for sliding, is provided in the slide plate 59 between the sides of the angle bar 56. A fixed aperture 61 is provided in an oval shape, and a screw 63, via a washer 62, protrudes through the aperture 61, and is attached to the back surface of the concave storage section 53. The slide plate 59 is provided with an aperture 65 having a projection 64, and a coil spring 66 is attached to the projection 64 with its other end attached to the angle bar 56. Furthermore, in order to make the slide plate 59 slide, a shaft 70 is formed with an inclined section 69 provided with the gap between a small diameter section 67 and a large diameter section 68. A spring coil 71 is attached to the small diameter section of the shaft 70 which protrudes through the aperture 60 provided in the slide plate 59, and then protrudes through the aperture 72 provided on the back face of the angle bar 56. A push button 74 having a brim 73 is attached to the end of the large diameter section 68 of the shaft 70, and the push button 74 projects in a forward direction from the aperture 75 provided in the cabinet 51.

On the back surface of the operating section 52, a stopper 76 is provided which projects from the aperture 54 provided in the back face of the concave storage section 53, and in both sides of the operating section 52, on the occasion that it is attached to the cabinet 51, rotating spindles 77 and 77', go to the center of the rotation. Also, an aperture 78 is formed on the bottom surface of the operating section 52, and a spring 80 attached to a shaft 79 is attached to the aperture part by the fixed plate 81. The spring 80 is united with a U-shaped related member (not shown on the drawings), having a part wrapped into a coil on both ends.

Then, in the case where the operating section 52 is stored in the storage section 53, the rotating spindles 77 and 77' provided in the side of the operating section 52, are inserted into the engagement openings 55 and 55' provided on the side of the storage section 53.

When the operating section 52 of the embodiment of the present invention constructed in the manner described, is in the open state, the slide plate 59 causes the inclined section 69 of the shaft 70 to slide on pushing the push button 74. Because of this, the engagement between the stopper 76 and the slide plate 59 is released and the operating section 52 is made to rotate by the spring 80 provided on the bottom surface of the operating section 52. Then, on rotating to a prescribed position, the stopper 76, maintains the operating section 52 in an open state as the stopper 76 is stressed toward the cabinet 51. Next, when the operating section 52 is closed, the slide plate 59 is made to slide into a fixed location on pushing the front surface of the operating section 52, and during the rotation, the slide plate 59 is made to slide with the strength of the spring 66, so that the slide plate 59 comes in contact with the stopper 76, and the operating section 52 is maintained in the closed state.

In this way, on the television set according to this embodiment of the present invention, because the direction of the rotation of the operating section 52, and the action direction of opening and closing the apparatus are deviated by 90 degrees, the operating section 52 will not inadvertently open even if it is subjected to a shock.

In order to store the remote control transmitter in the operating section 52 of this embodiment of the present invention, a U-shaped storage section is provided in the inner side of the operating panel.

Figure 13:
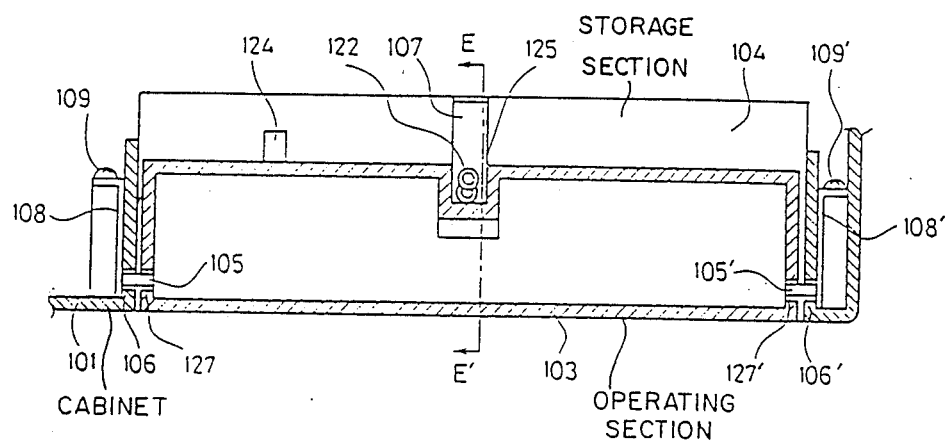
FIG. 13 is a sectional plan view of still another embodiment of a channel selecting panel holder according to the present invention.
Figure 14:
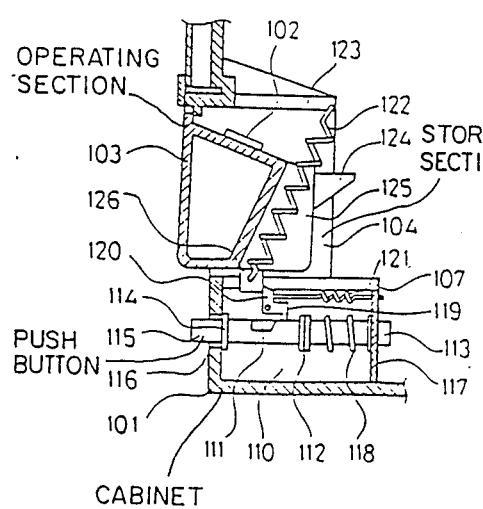
FIG. 14 is a sectional view taken on the line E-E' in FIG. 13 in the direction of the arrows.
Figure 15:
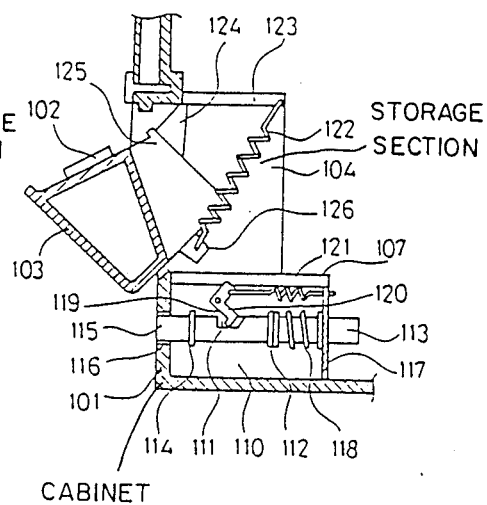
FIG. 15 is a sectional side elevational view of the operating section in the open condition of the channel selecting panel holder shown in FIG. 14.
Figure 16:
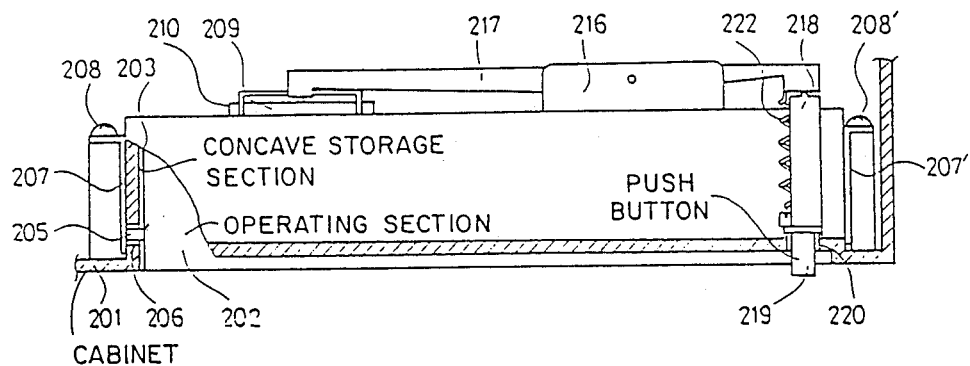
FIG. 16 is a cutaway plan view of a further embodiment of a channel selecting panel holder according to the present invention.
Figure 17:
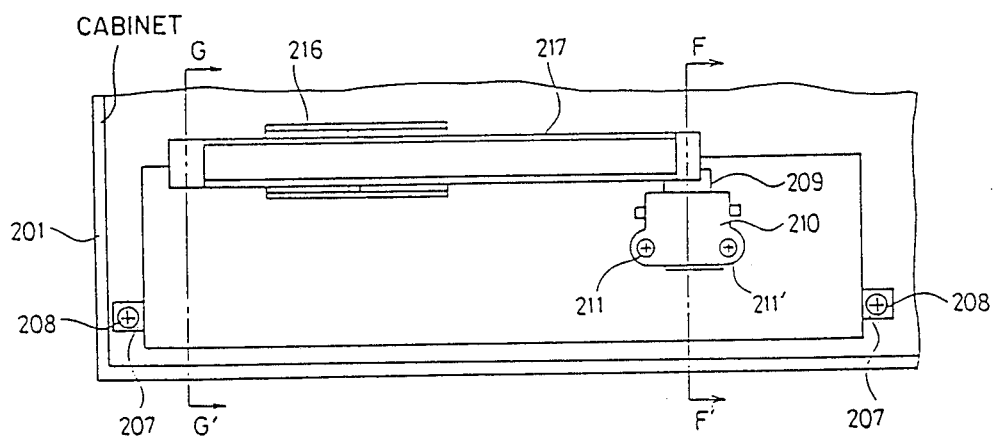
FIG. 17 is a rear view of the front surface of a cabinet containing a further embodiment of the present invention.
Figure 19:
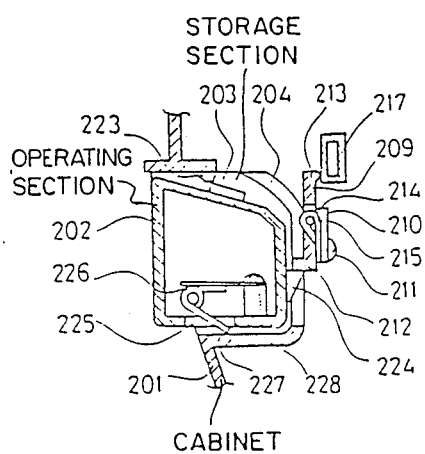
FIG. 19 is a sectional view taken on the line G-G' in FIG. 17 in the direction of the arrows.
Figure 18:
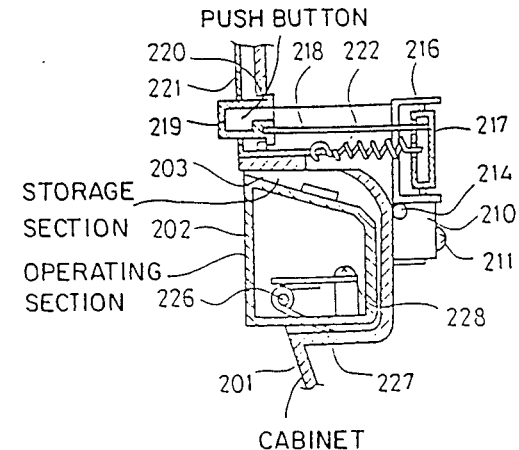
FIG. 18 is a sectional view taken on the line F-F' in FIG. 17 in the direction of the arrows.
Figure 20:
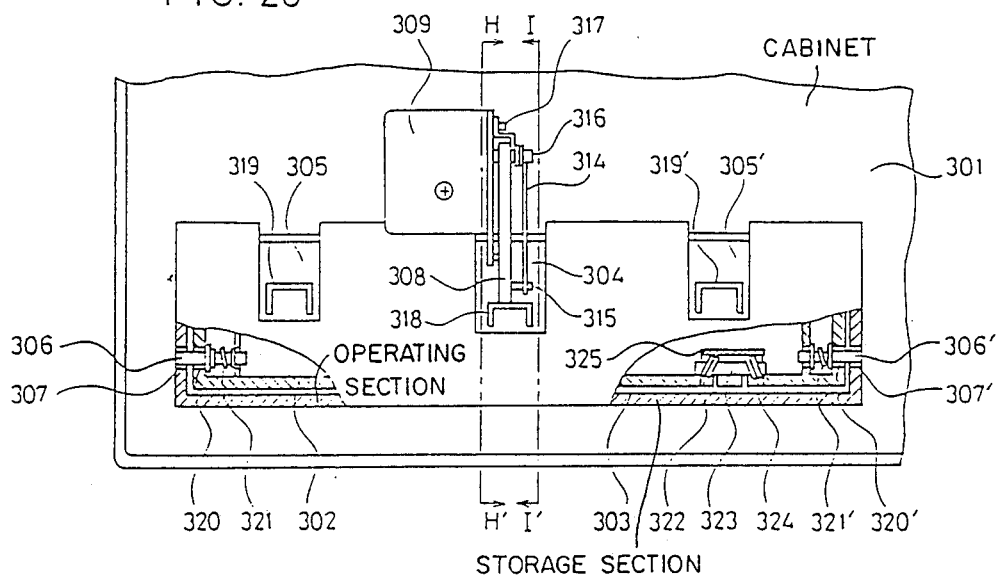
FIG. 20 is a cutaway plan view of a further embodiment of a channel selecting panel holder according to the present invention.
Figure 21:
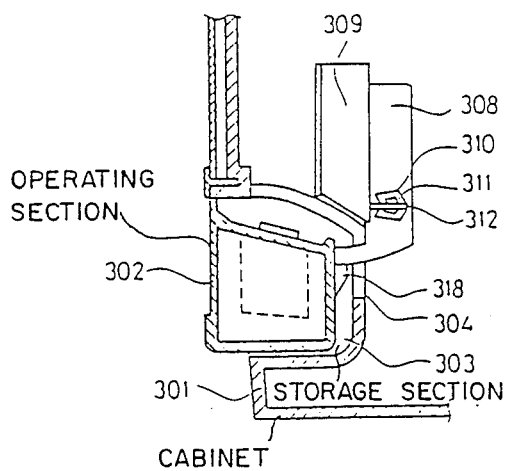
FIG. 21 is a sectional view taken on the line H-H' in FIG. 20 in the direction of the arrows.
Figure 22:
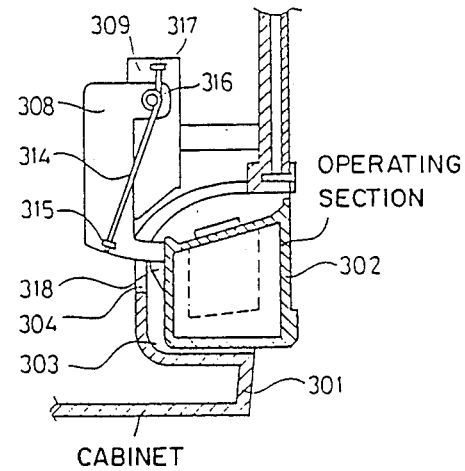
FIG. 22 is a sectional view taken on the line I-I' in FIG. 20 in the direction of the arrows.

The following is an explanation of another embodiment of the present invention which is illustrated in FIG. 13 to FIG. 15.

A storage section 104 in the front face of a television set cabinet 101 stores an operating section 103 provided with a channel changing button 102 or the like, and the operating section 103 is fixed on both side faces of the storage section 104. Engagement members 105 and 105', share the center of the rotation, are inserted into apertures 106 and 106'. A cut 107 is provided on the back face of the storage section 104. Then, the engagement members 105 and 105' attached to one end of a metal fitting 108 and 108' are inserted into the apertures 106 and 106', from the outside of storage section 104, and the metal fittings 108 and 108' are affixed to the cabinet 101 by screws 109 and 109'. A rotating means 110 for rotating the operating section 103, is provided in the bottom of storage section 104. The rotating means 110 has a shaft 113 provided with a convex section 111 and a brim 112, and on the front end of the shaft 113 there is installed a push button 115 having a brim 114. Then, the push button 115 protrudes in a forward direction through an aperture 116 provided in the front face of the cabinet 101, and at the same time inserts into an aperture (not shown on the drawings) provided in a fixed plate 117 on the end of the shaft 113. A coil spring 118 is attached between the fixed plate 117 and the brim 112, and usually is protruded by the push button 115 in a forward direction. In the vicinity of the shaft 113, an L-shaped engagement member 120 having a convex section 119 on its side surface, is rotatably provided, and the convex member 119 is made to press by the spring 121 against the upper surface of the shaft 113. Furthermore, a fixed member 123 into the upper side of the storage section 104 is secured to fix a spring 122 for rotating the operation section 103.

A spring 122 is provided in the back surface of the operating section 103, and a cut 125 is provided for installing a spring 122 in the central section of the back surface of the operating section 103. On the bottom surface, a projection 126, to which a spring 122 is attached, is provided in the vicinity of the cut 125. In both side surfaces, apertures 127 and 127' are inserted into engagement members 105 and 105' as a fulcrum for rotation.

When the operating section 103 is stored in the storage section 104, the engagement members 105 and 105' are pushed back by the action of pushing the operating section 103 into the storage section 104 with the help of the elasticity of the metal fittings 109 and 109'. In addition, on pushing it in, the engagement members 105 and 105' are inserted into the apertures 127 and 127' provided in the side face of the operating section 103, and the operating section 103 is then able to rotate freely in the cabinet 101. A spring 122 is installed in the space between the fixed member 123 provided on the upper side of the storage section 104 and the projection 126 provided on the lower surface of the operation section 103.

When the operating section 103 is in the open state, the convex member 119 provided on the engagement member 120 is made to protrude into the concave member 111 provided on the shaft 113 by pressing the push button 115, and the engagement member 120 is made to turn by the strength of the spring 121. Because of this, the engagement of the projection 126 provided on the lower surface of the operating section 103 is released, so that the operating section 103 is rotated with the spring 122 until the stopper 124 is attached to the cabinet 101. The operating section 103 is permitted to open with touching of the cabinet 101. Also, when the operating section 103 is stored, the projection 126 is engaged with engaging member 120 by pushing the front surface of the operating section 103, so that the closed state of the operating section 103 is maintained.

Accordingly, in the abovementioned embodiment, the opening and closing operations of the apparatus can be easily enabled, and because the parts can be miniaturized, they can be modified so that there is no worry of causing unsatisfactory operation.

Also, in this embodiment, a convex storage section is provided in the operating panel surface of the operating section 103, and a remote control transmitter can be stored.

The following is an explanation of still another embodiment of the present invention which is illustrated in FIG. 16 to FIG. 19.

First, a concave storage section 203 which stores an operating section 202 is formed in the front face of a television set cabinet 201. An elongated 204 is provided on the back surface of the concave storage section 203, and also engagement members 205 and 205' are provided which fits into apertures 206 and 206'. Then, L-shaped metals 207 and 207' made of an elastic material having the cylindrical engagement members 205 and 205' in its one end, is attached to the cabinet 201 by screws 208 and 208' in the outside surface of the concave storage section 203, and the engagement members 205 and 205' is made to protrude through the apertures 206 and 206' into the concave storage section 203. Also, a lock plate 209 on the back outside surface of the concave storage section 203, maintaining the operating section 202 in a stored state, is attached to a rotatably installed fixed plate 210 by screws 211 and 211'. An engagement portion 212 is provided to maintain the operating section 202 on the lower end of the front surface of the lock plate 209, and a convex section 213 is provided on the upper end of the back surface of the lock plate 209. A spring 215 is attached to a shaft section 214 which is in the center of the rotation to cause the engagement portion 212 to usually stress in the forward direction. Furthermore, a teetering plate 217 attached to a U-shaped angle bar 216 is provided on the back outside face of the concave storage section 203. One end of the teetering plate 217 faces the convex section 213 of the lock plate 209, and a slide plate 218 is attached to the other end. A push button 219 is attached to the leading end of the slide plate 218, and the push button 219, by means of an aperture 220 provided on the front face of the cabinet 201, is made to project in a forward direction, and is made to usually project in a forward direction by means of a spring 222 attached between one end of the teetering plate 217 and the end of a bent cosmetic plate 221 provided on the inside of the front surface of the cabinet 201. Also, a convex engagement member 223 is provided to stop the operating section 202 in a prescribed position when it is opened on the inside upper surface of the concave storage section 203. On the other hand, on the rear surface of the operating section 202, a projection 224 is provided, projecting through the elongated aperture 204 in the concave storage section 203, and apertures (not shown on the drawings) are provided in both side surfaces, penetrated by the engagement members 205 and 205'. Also, an aperture 225 is provided in the bottom surface of the operating section 202, and a spring 227 attached to a shaft 226 is secured by an angle bar 228.

In the channel selecting panel holder constructed in the manner outlined above, when the operating section 202 is in the open state, the slide plate 218 rotates the teetering plate 217 by pushing the push button 219 until the other end of the teetering plate 217 is rotated in the forward direction. Because of this, the lock plate 209 is pushed and rotated, and the engagement member 212 is separated from the projection 224, so that the operating section 202 is made to rotate by the strength of the spring 227. Then, on rotating as far as a prescribed position, the projection 224 maintains the operating section 202 in the open state according to the concave engagement member 223. Also, when in the closed position, the projection 224 engages the engaging member 212 of the lock plate 209 by pushing the operating section 202 on the front surface by hand and causing it to rotate, so that causes the operating section 202 to be maintained in the closed state.

Accordingly, in the above embodiment of the present invention, by varying the length of the teeter plate 217 and the position of the fulcrum, the position of the push button 219 can be freely selected, and at the same time the pressure required to activate the push button 219 can be easily adjusted.

A concave storage section is provided in the inside upper surface of the operating panel of the above operating section 202, and a remote control transmitter can be stored.

The following is an explanation of another embodiment of the present invention which is illustrated in FIG. 20 to FIG. 24.

Figure 23:
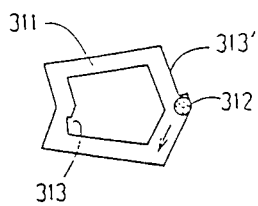
FIG. 23 and FIG. 24 are enlarged views of a cam.

First, a concave storage section 303 which stores an operating section 302 is formed in the front face of a television set cabinet 301, and, in the back surface of the concave storage section 303, a plurality of apertures 304 and 305 and 305' are provided, and, in both side surfaces of the concave storage section 303, engagement members 306 and 306' penetrates apertures 307 and 307'. In addition, in the aperture of the back side surface of the concave storage section 303, a U-shaped lock plate 308 is rotatably secured by an angle bar 309. A heart cam 310 is provided on one side surface of the lock plate 308, and an L-shaped guide pin 312 protrudes through a attached angle bar 309 and penetrates a slot 311 formed in the heart cam 310. Engagement portions 313 and 313' are provided in the necessary location in the slot 311, as shown in FIG. 23, in order to prevent the guide pin 312 from reversing, so that the guide pin slides in the direcion of the arrow. Also, in another direction of the side of the lock plate 308, there is provided a convex section 315 onto which is hooked a spring 314, and, in one end of the spring 314, a shaft 316 is hooked which is in the center of the rotation of the lock plate 308 united with an attached angle bar 309. The other end of the spring 314 is hooked onto the convex portion 317 provided on the attached angle bar 309, and acts to make the lower end of the lock plate 308 normally protrude in a forward direction. On the other hand, a projection 318 for engaging the lock plate 308 is provided on the back surface of the operating section 302 in the location of the aperture 304, and, in part of other apertures 305 and 305', when the operating section 302 is open, stoppers 319 and 319' are provided to maintain the operating section 302 in a prescribed position. Also, on both sides of the operating section 302, apertures 320 and 320' are provided, and from the inner side of the operating section 302, the engagement members 306 and 306' stressed by springs 321 and 321' projects into the outside of the operating section 302 through the apertures 320 and 320'. Furthermore, an aperture 322 is formed in the bottom surface of the operating section 302, and the spring 324 attached to the shaft 323 is engaged with the aperture 322 by means of a fixed member 325.

Then, when the operating section 302 is stored in the concave storage section 303, the engagement members 306 and 306' are pushed back into the inside of the operating section 302 by pushing the operating section 302 into the storage section 303, Furthermore, on pushing the operating section 302 into the concave storage section 303, the engagement members 306 and 306' are made to project into the apertures 307 and 307' provided on the side of the concave storage section 303, by the strength of the springs 321 and 321'. The operating section 302 is stored in the concave storage section 303.

Figure 24:
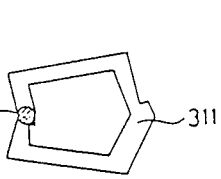

In the channel selecting panel holder constructed as outlined above, when the operating section 302 is open, the guide pin 312 moves along the slot 311 on applying pressure to the front surface of the operating section 302, and when the guide pin reaches the position illustrated in FIG. 24, it is secured by the lock plate 308, by being rotated in the rear direction. For this reason, the engagement between the lock pin 308 and the projection 318 is released, and the operating section 302 is made to rotate by the strength of the spring 324. Then, on rotating as far as a prescribed position, the stoppers 319 and 319' maintain the operating section 302 in the closed state with touching the cabinet 301. Also, when the operating section 302 is stored, the upper section of the rear face of the operating section 302 touches the lock plate 308 on applying pressure to the front surface of the operating section 302, the guide pin 312 is moved to the original position, and the lock pin 308 is rotated in the forward direction. Because of this, the lock plate 308 and the projection 318 are engaged, and the operating section 302 is maintained in the stored state.

In this way, in the above mentioned embodiment, a push button is unnecessary to remove the operating section 302, and the design can be improved while, the number of parts can be reduced, making it possible to reduce cost and eliminate worry about faulty operation. Also, a concave storage section is provided so that a remote control transmitter can be stored in the operating panel of the operating section 302.

In the present invention, the operating means for channel selection and the like in the television receiver is provided as a remote control transmitter which can also be stored in the operating section. When the remote control transmitter is to be used, the operating section is rotated, causing it to open in the forward direction, and the remote control transmitter can then be removed and utilized.

The present invention is not just applicable to television sets, but can also be used on video recorders and the like, and has a wide range of application.

The invention thus being described, it will be obvious that the same may be varied in many ways. Such variations are not to be regarded as a departure from the spirit and scope of the invention, and all such modifications are intended to be included within the scope of the following claims.

What is claimed is:

1. A channel selecting panel holder housing comprising:
    a cabinet having a front face;

a storage section provided in the front face of said cabinet;

operating means rotatably attached within said storage section, said operating means being rotatable between an open state and a closed state, and said operating means having an obverse face forming a substantially continuous surface with the front face of the cabinet when the operating means is in the closed state;

engaging means for maintaining said operating means in a closed state;

shaft means for stressing and engaging the engaging means, the shaft means being spring biased by an elastic material;

stopper means for maintaining said operating means in an open state;

rotation means for rotating said operating means; and a remote control transmitter for performing channel selection, said remote control transmitter being removably stored in said operating means, said remote control transmitter being hidden from view by said obverse face when said remote control transmitter is stored in said operating means and said operating means is in a closed state.

2. The channel selecting panel holder housing as recited in claim 1, further comprising a tubular reflection element for reflecting a signal sent from said transmitter.

3. A channel selecting panel holder housing comprising:

a cabinet having a front face;

a storage section provided in the front face of said cabinet;

operating means rotatably attached within said storage section, said operating means being rotatable between an open state and a closed state, and said operating means having an obverse face forming a substantially continuous surface with the front face of the cabinet when the operating means is in a closed state;

lock means for maintaining said operating means in a stored condition in said storage section, said lock means being rotatably provided on the outside of said storage section;

rotation means for rotating said lock means;

regulation means for regulating action of said lock means;

engaging means for engaging said lock means;

stopper means for maintaining said operating means in an open state; and a remote control transmitter for performing channel selection, said remote control transmitter being removably stored in said operating means, said remote control transmitter being hidden from view by said obverse face when said remote control transmitter is stored in said operating means and said operating means is in a closed state.

4. The channel selecting panel holder housing as recited in claim 3, further comprising a tubular reflection element for reflecting a signal sent from said transmitter.

* * * * *